United States Patent [19]

Arimura

[11] 4,186,412

[45] Jan. 29, 1980

[54] APPARATUS FOR DETECTING THE POSITION OF FINE OBJECT

[75] Inventor: Yoshiaki Arimura, Yokohama, Japan

[73] Assignee: Tokyo Shibaura Electric Co., Ltd., Kawasaki, Japan

[21] Appl. No.: 858,331

[22] Filed: Dec. 7, 1977

[30] Foreign Application Priority Data

Dec. 8, 1976 [JP] Japan .............................. 51/147487

[51] Int. Cl.² ............................................. H04N 7/18
[52] U.S. Cl. .............................. 358/101; 235/92 MP; 358/107
[58] Field of Search .............................. 358/101, 107; 235/92 PD, 92 MP

[56] References Cited

U.S. PATENT DOCUMENTS

| | | | |
|---|---|---|---|
| 3,603,728 | 9/1971 | Arimura | 358/101 |
| 4,044,377 | 8/1977 | Bowerman | 358/107 |

Primary Examiner—Howard W. Britton
Attorney, Agent, or Firm—Finnegan, Henderson, Farabow & Garrett

[57] ABSTRACT

To detect the position and inclination of an IC pellet with two position marks on its surface, the following steps are taken. First, an image of the IC pellet is focussed on the photosensitive surface of a television camera. Then, the photosensitive surface with said image is scanned with a small raster, thereby detecting the coordinate of a first position mark. Thereafter, the scanning raster is shifted to the second position mark and scans the same, thereby detecting the coordinate of the second position mark. A coordinate signal which corresponds to the detected coordinates of the first and second position marks is fed into an arithmetic operation device, which computes the central coordinate and angle of inclination of the IC pellet.

9 Claims, 7 Drawing Figures

APPARATUS FOR DETECTING THE POSITION OF FINE OBJECT

BACKGROUND OF THE INVENTION

This invention relates to an apparatus for detecting the position and inclination of a fine object.

When an integrated circuit (IC) pellet is bonded on a bonding base, it is necessary to detect the position and inclination of the IC pellet. To detect the position and inclination of an IC pellet, at least two position marks are usually provided on the pellet at different positions. Then, a television camera forms an image of the IC pellet. Based on the image signals from the television camera there are obtained the coordinate of each position mark. According to the coordinates of the position marks thus obtained, the position and angle of inclination are detected.

As apparatus which detects the position and inclination of a fine object in such a manner as mentioned above is disclosed in U.S. Pat. No. 3,603,728. But in some cases such conventional apparatus fails to perform its function for the following reason.

To focus an enlarged image of an IC pellet on the photosensitive surface of a television camera, a magnifier should be used. In this case, the magnification of the magnifier is selected so that the two position marks fall within the scanning region of the photosensitive surface of the television camera. Thus, if the two position marks are provided on the opposite edge portions of the IC pellet for some reason, the magnification of the magnifier should inevitably be lowered. Otherwise, both position marks would not fall within the limited scanning region. As a result, the image of the IC pellet obtained becomes small, and the position marks look very small, too. Thus, when such small position marks are scanned, no image signals having a large amplitude can be obtained. Consequently, desirable signals which represent the position of the IC pellet cannot be obtained, and the position of the IC pellet cannot be accurately detected.

To eliminate the above-mentioned drawbacks, the position marks may be made broader or larger. However, an IC pellet is so small and the circuit pattern on it is so dense that the position marks can hardly be made larger. Instead, the television camera and the magnifier may be moved together, or only the magnifier is moved, thereby to magnify much more one position mark at a time. This method, however, not only requires a very complicated apparatus but also is impracticable since it is very difficult to move and stop the television camera and/or the magnifier precisely at the right position. Further, this method requires much time to detect the position of the IC pellet, due to the necessary movements of mechanical devices. Thus, it is impossible with this method to carry out IC pellet bonding efficiently.

SUMMARY OF THE INVENTION

The object of this invention is to provide an apparatus for detecting the position and inclination of a fine object with position marks on its surface, no matter where the marks are provided or how small the marks are.

According to this invention, a magnified image of a fine object having at least two position marks on its surface is focussed on the photosensitive surface of a television camera. The surface regions of the object, each including one position mark, are scanned one after the other with a scanning raster having a reduced size, thereby obtaining image signals. Based on the image signals thus obtained from the television camera, the coordinate of each of the position marks is detected. Then, based on the detected coordinates of the marks the central coordinate and angle of inclination of the fine object are computed by an arithmetic operation device, thus detecting the position and inclination of the fine object.

DETAILED DESCRIPTION OF THE PREFERRED EMBODIMENT

Figure 1:
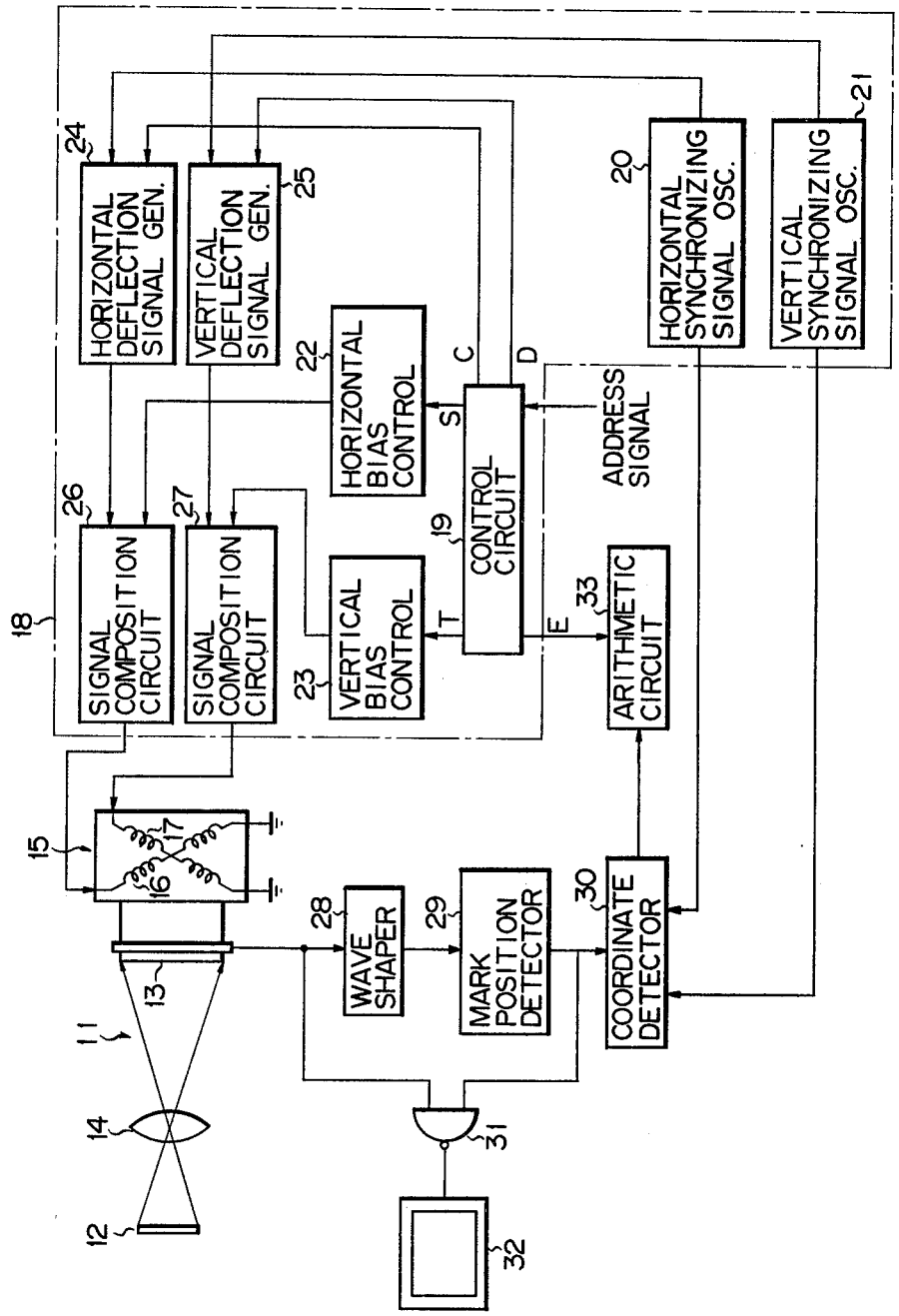
FIG. 1 is a block diagram of an embodiment of this invention.

A television camera 11 shown in FIG. 1 comprises an optical system 14 for focussing an enlarged image of a fine object, e.g. an integrated circuit pellet 12, on a photosensitive surface 13. The camera 11 further comprises a deflection yoke 15 which includes a horizontal deflection coil 16 and a vertical deflection coil 17. These deflection coils 16 and 17 are connected to a scanning signal generator circuit 18.

The scanning signal generator circuit 18 comprises a control signal generator circuit and memory 19, a horizontal synchronizing signal oscillator 20, a vertical synchronizing signal oscillator 21, a horizontal bias control circuit 22, a vertical bias control circuit 23, a horizontal deflection signal generator circuit 24, a vertical deflection signal generator circuit 25, a horizontal signal composition circuit 26 and a vertical signal composition circuit 27. The deflection signal generator circuits 24 and 25 are connected to receive signals, respectively, from terminals C and D of the memory of the control signal generator circuit 19 and the synchronizing signal oscillators 20 and 21. The horizontal signal composition circuit 26 is connected to receive signals from the horizontal bias control circuit 22 controlled by raster position data read out from the memory of control signal generator circuit 19 through terminal S thereof and signals from the horizontal deflection signal generator circuit 24. The vertical signal composition circuit 27 is connected to receive signals from the vertical bias control circuit 23 controlled by a raster position data read out from the memory of the control signal generator circuit 19 through the terminal T thereof and signals from the vertical deflection signal generator circuit 25.

The output of the camera 11 is supplied through a wave shaper 28 to a mark position detector 29. The output of the mark position detector 29 is coupled to a mark position coordinate detector 30, which is coupled to the output of the horizontal synchronizing signal oscillator 20. Both the output of the camera 11 and the output of the mark position detector 29 are coupled through an OR gate 31 to a monitor television 32. To the output of the mark position coordinate detector 30 an arithmetic operation circuit 33 is coupled to obtain a central coordinate and an angle of inclination of an IC pellet in accordance with a mark position coordinate signal from the detector 30.

It will now be described how the position detecting apparatus shown in FIG. 1 operates.

Figure 2:
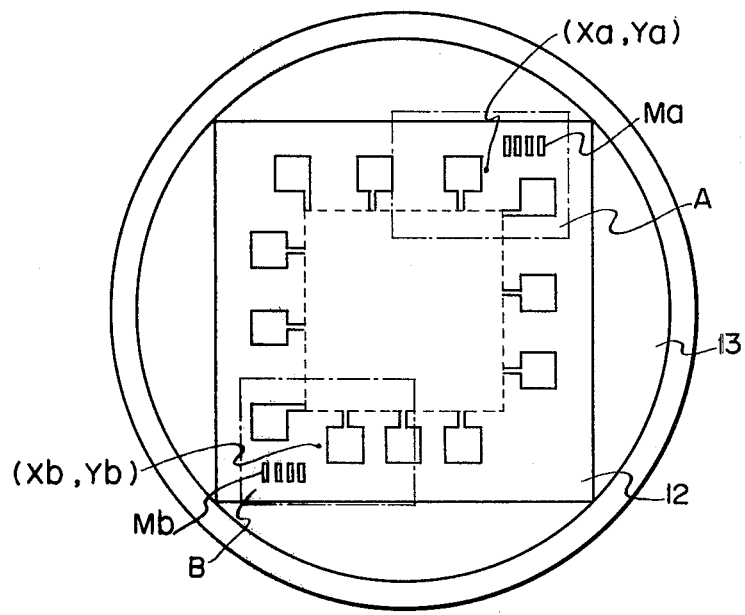
FIG. 2 shows an IC pattern focussed on the photosensitive surface of a television camera.

First, an IC pellet 12 is put on a bonding base (not shown). Then, the optical system 14 focusses an enlarged surface pattern image of the IC pellet 12 on the photosensitive surface 13, as illustrated in FIG. 2. The photosensitive surface 13 is scanned by an electron beam (not shown) as the scanning signals are supplied from the scanning signal generator circuit 18 to the horizontal deflection coil 16 and the vertical deflection coil 17. This scanning is performed on a region A or B of the surface 13 which is smaller than the usual scanning region indicated by a one-dot dash line in FIG. 2.

In order to scan such a small region, a scanning signal having a small amplitude is supplied to the deflection yoke 15. Further, the position of the small scanning region is changed by varying the bias voltage of such a scanning signal. The bias voltage of the scanning signal is varied within the scanning signal generator circuit 18 in the following manner.

The memory of the control signal generator circuit 19 is storing data indicating the positions of at least two position marks provided on an IC pellet. The position marks are formed on specified parts of the IC pellet, which are specific to the type of the IC pellet. For example, on a substantially square or rectangular pellet of one type two position marks are formed on the opposing edge portions, and a substantially square or rectangular pellet of another type two position marks are formed on the opposing corner portions. Thus, if the type of an IC pellet is known, the positional relationship between the position marks can be recognized. The positional relationship of the marks may therefore be utilized to preset the shift position of a raster.

The position marks on the IC pellet shown in FIG. 2 are detected by scanning both the regions A and B. Thus, if they are preset, the coordinate data representative of the central coordinate (Xa, Ya) of the scanning region A and the central coordinate (Xb, Yb) of the scanning region B, both regions A and B can be automatically scanned by reading out the coordinate data during the position mark detection.

Such a coordinate data is allotted to an IC pellet of each type and is stored in the memory of the control signal generator circuit 19. When an IC pellet 12 is put onto the bonding base, there is provided a corresponding address signal in response to which the coordinate data is read out from the memory of the circuit 19. The data read out from the circuit 19 is supplied to the horizontal bias control circuit 22, the vertical bias control circuit 23, the horizontal deflection signal generator circuit 24 and the vertical deflection signal generator circuit 25 through the respective terminals S, T, C and D.

The data through the terminals C and D are data for reducing the amplitudes of deflection signals of the horizontal and vertical deflection signal generator circuits 24 and 25. The amplitude of each deflection signal is reduced to such an extent that the scanning raster is several times as small as an ordinary one and substantially to the same extent in any types of IC pellets.

The data through the terminals S and T are digital data representing the central coordinate of the scanning region A and the central coordinate of the scanning region B, respectively. One digital signal is converted into a corresponding analog signal by the horizontal bias control circuit 22, and the other digital signal is converted into a corresponding analog signal by the vertical bias control circuit 23. The signals from the deflection signal generator circuits 24 and 25 are supplied to a signal composition circuits 26 and 27, respectively, and the signals from the bias control circuits 22 and 23 to the signal composition circuits 26 and 27, respectively.

Figure 3:
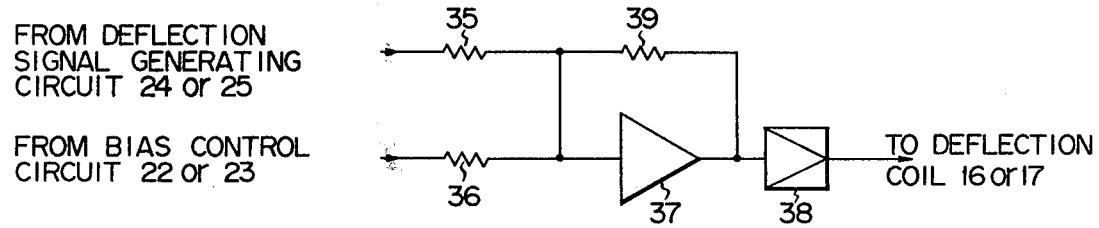
FIG. 3 is a circuit diagram of the signal composition circuit used in the apparatus shown in FIG. 1.

The signal composition circuits 26 and 27 are constructed as illustrated in FIG. 3. That is, each signal composition circuit comprises a pair of resistors 35 and 36, an operational amplifier 37, a current amplifier 38 and a resistor 39. The input terminal of the operational amplifier 37 is connected to the output terminal of, for example, the horizontal deflection signal generator circuit 24 through the resistor 35 and also to the output terminal of, for example, the horizontal bias control circuit 22 through the resistor 36. The output terminal of the operational amplifier 37 is connected to, for example, the horizontal deflection coil 16 through the current amplifier 38. The resistor 39 is connected between the input and output terminals of the operational amplifier 37.

Figure 4:
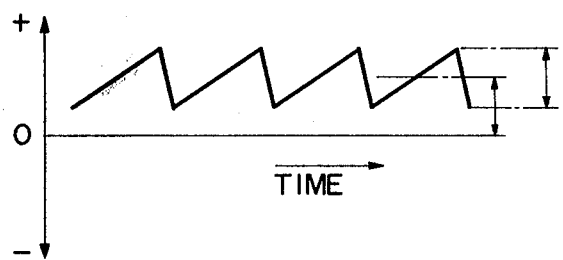
FIG. 4 shows the waveform of a scanning signal from the signal composition circuit shown in FIG. 3.

The signal composition circuit 26 combines a deflection signal with a reduced amplitude from the horizontal deflection signal generator circuit 24 and a bias voltage control signal from the horizontal bias control circuit 22, thereby forming such a scanning signal as shown in FIG. 4. Similarly, the signal composition circuit 27 combines a deflection signal with a reduced amplitude from the vertical deflection signal generator circuit 25 and a bias voltage control signal from the vertical bias control circuit 23, thereby forming such a scanning signal as illustrated in FIG. 4. The scanning signal from the signal composition circuit 26 is supplied to the horizontal deflection coil 16, and the scanning signal from the signal composition circuit 27 to the vertical deflection coil 17.

Figure 5:
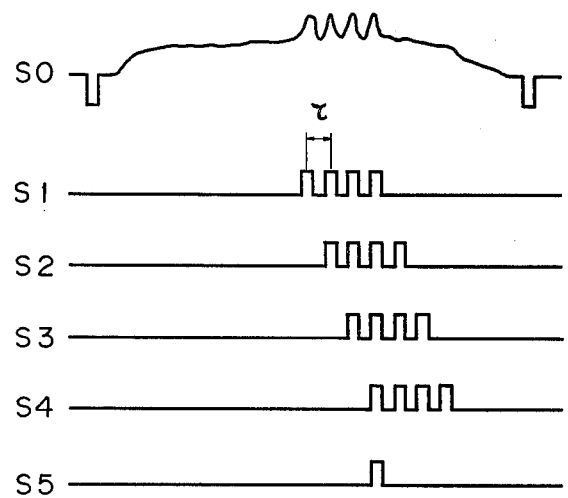
FIG. 5 shows the waveform of a signal corresponding to the pattern of a position mark.

When the scanning signal generator circuit 18 supplies the deflection yoke 15 with a scanning signal and, for example, the scanning region A scans in response to the scanning signal, an image signal showing the pattern of the region A is delivered from the output of the television camera 11. This image signal is supplied to the wave shaper 28 and is converted into a pulse signal. For example, if a scanning beam scans a position mark Ma, such an image signal S0 as shown in FIG. 5 is delivered from the output of the camera 11. The image signal S0 is converted into a pulse signal S1 by the wave shaper 28 and then is supplied to the mark position detector 29.

Figure 6:
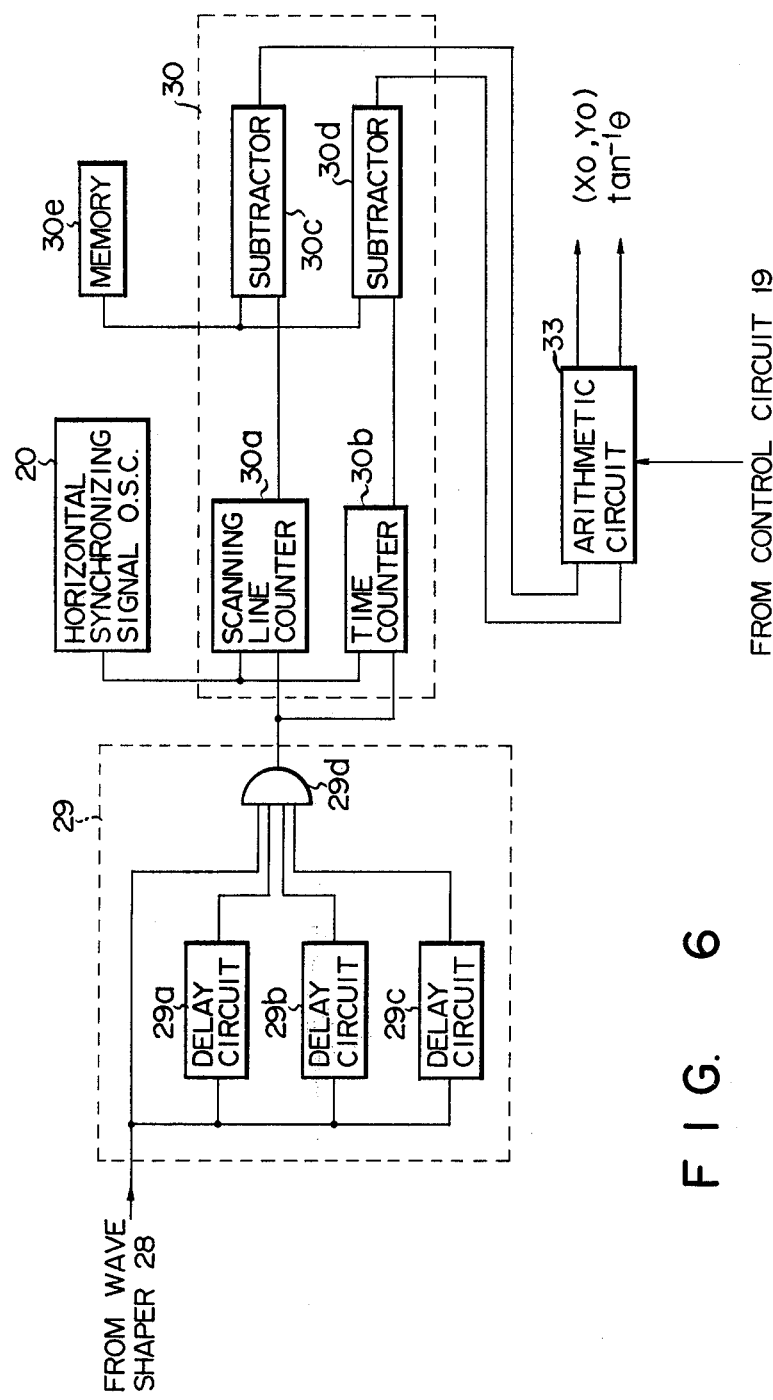
FIG. 6 is a block circuit diagram of a mark position detector and a block circuit diagram of a coordinate detector.

As shown in FIG. 6, the mark position detector 29 comprises three delay circuits 29a, 29b and 29c and one AND circuit 29d. These delay circuits 29a, 29b and 29c provide a delay time t, a delay time 2t and a delay time 3t, respectively. Delay time t corresponds to the pulse interval τ of the pulse signal. Thus, every time a pulse signal S1 is supplied to the mark position detector 29, the delay circuits 29a, 29b and 29c generates a pulse signal S2, a pulse signal S3 and a pulse signal S4, respectively. These pulse signals S2, S3 and S4 and the pulse signal S1 are supplied to the AND circuit 29d. Then the AND circuit 29d produces a pulse signal S5. The pulse signal S5 is supplied to the mark position coordinate detector 30.

As illustrated in FIG. 6, the mark position coordinate detector 30 is constituted by a scanning line counter 30a, a time counter 30b and two subtractors 30c and 30d. The counters 30a and 30b are supplied with the horizontal synchronizing pulse signals from the horizontal synchronizing signal oscillator 20. Based on the pulse signals it has received, the scanning line counter 30a counts the number of scanning lines, i.e. the first scanning to the scanning line which extends across the position mark Ma. Similarly, based on the pulse signals it has received, the time counter 30b counts the time from the start of scanning to the scanning of the position detecting mark Ma.

Figure 7:
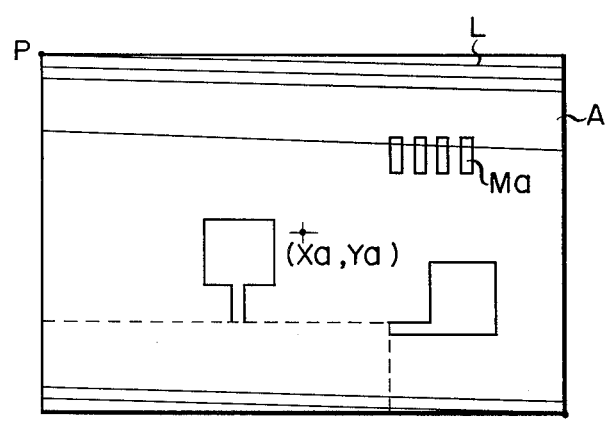
FIG. 7 shows the pattern of reduced scanning raster.

Namely, as shown in FIG. 7, when the scanning is started from the scanning start point P, the scanning line counter 30a begins counting the synchronizing pulse signals from the oscillator 20. On the other hand, the time counter 30b begins counting time upon receipt of a synchronizing pulse signal which corresponds to the scanning start point P. Both counters 30a and 30b keep on working until the position mark Ma is scanned by the scanning line L. When the mark Ma is scanned, the AND circuit 29d of the mark position detector 29 delivers a pulse signal S5. Thus, in other words, the counters 30a and 30b stop working upon receipt of the pulse signal S5 from the mark position detector 29.

When the scanning line counter 30a stops working, it stores the number Na of scanning lines, i.e. from the first scanning line to the scanning line which extends across the position mark Ma. When the time counter 30b stops working, its count corresponds to the scanning time Ta, i.e. from the scanning of the point P to the scanning of the mark Ma. The count of the counter 30a is supplied to the subtractor 30c, and the count of the counter 30b to the subtractor 30d. A memory 30e is stored with data showing half the number N of scanning lines which extends across each of the entire scanning regions A and B and data showing half the scanning time T necessary to scan the entire scanning regions A and B. The counter 30a is also supplied from memory 30e with a data showing half the number N of scanning lines which extends across the entire scanning region A, while the counter 30b is supplied from the memory 30e with a data showing half the scanning time T necessary to scan the entire scanning region A. Data N/2 and data T/2 apparently represent the central coordinate of the scanning region A. Thus, the subtractors 30c and 30d cooperate to figure out the position of the mark Ma with respect to the central coordinate of the region A. More specifically, the subtractors 30c and 30d carry out the following subtractions (1) and (2), respectively:

(1) $(N/2) - Na$
(2) $(T/2) - Ta$.

The various results of the subtraction (1) show the various positions of the mark Ma as shown below:

If $(N/2) - Na > 0$, the mark Ma is on $+Y$ axis.
If $(N/2) - Na = 0$, the mark Ma is on the origin of Y axis.
If $(N/2) - Na < 0$, the mark Ma is on $-Y$ axis.

Similarly, the various results of the subtraction (2) indicate the various positions of the mark Ma as shown below:

If $(T/2) - Ta > 0$, the mark Ma is on $+X$ axis.
If $(T/2) - Ta = 0$, the mark Ma is on the origin of X axis.
If $(T/2) - Ta < 0$, the mark Ma is on $-X$ axis.

In the above-mentioned way there can be obtained the coordinate (Xa1, Ya1) of the position mark Ma with respect to the central coordinate (Xa, Ya) of the scanning region A. The data on the coordinate (Xa1, Ya1) thus obtained are stored into a memory provided within the arithmetic operation circuit 33.

After the coordinate of the position mark Ma has been obtained, two data are read out from the memory of the control circuit 19 through the terminals S and T. According to the data the scanning region B is scanned. Then the mark position detector 29 detects a position mark Mb existing in the region B and generates a pulse signal which corresponds to the position mark Mb. Upon receipt of this pulse signal, the mark position coordinate detector 30 obtains the coordinate (Xb1, Yb1) of the mark Mb in the same manner as the coordinate (Xa1, Ya1) of the mark Ma has been obtained.

Based on the coordinate (Xa1, Ya1) of the mark Ma and the coordinate (Xb1, Yb1) of the mark Mb, the arithmetic operation circuit 33 computes the central coordinate (X0, Y0) and angle $\theta$ of inclination of the IC pellet 12 in the following manner.

First, the X axis and Y axis components of the distance between mark Ma having coordinates (Xa1, Ya1) of the scanning region A and mark Mb having coordinates (Xb1, Yb1) of the scanning region B are detected. The data on the X axis and Y axis components of distance is supplied from the bias control signal generator circuit 19 to the arithmetic operation circuit 33. The arithmetic operation circuit 33 carries out an arithmetic operation based on this data and the data showing the coordinates (Xa1, Ya1) and (Xb1, Yb1), thereby obtaining the central coordinate (X0, Y0) and the angle $\theta$ of inclination of the IC pellet 12.

As mentioned above, according to this invention, a scanning region on an IC pellet, which is far smaller than the ordinary scanning region on the photosensitive surface 13 of a television camera 11, is scanned along as many scanning lines as the ordinary scanning region is scanned. That is, the small scanning region is scanned with a small scanning raster. Then another small scanning region on the IC pellet is scanned with the small scanning raster. As a result, at least two position marks provided on the IC pellet can be detected in the form of mark signals having a large amplitude. According to these mark signals the position of the IC pellet can be accurately detected.

Further, since the scanning raster can be shifted from one scanning region to another by an electric circuit alone, it is shifted with a high precision. The electric circuit is more simple and more easy to operate than a mechanical raster-shifting device and serves to detect the position marks at a higher speed. Still further, since the size of the scanning raster can be adjusted merely by varying the amplitude of the horizontal and vertical deflection signals, a scanning raster of any desired size can be used, from the ordinarily sized one to a considerably small one.

In the above-mentioned embodiment, the electromagnetic deflection system is employed. Instead, the electrostatic deflection system may be used in the apparatus according to this invention. The deflection coils or deflection electrodes may be used solely in scanning the scanning regions while additional deflection coils or electrodes are employed to shift the scanning raster from one scanning region to another, or they may be used both in scanning the regions and in shifting the scanning raster. In the above-described embodiment, the scanning raster is moved from one region to another. But if the two position marks are provided on the IC pellet very close to each other, the raster need not be shifted at all.

What is claimed is:

1. An apparatus for detecting the position and inclination of a fine object having at least two position marks on its surface, said apparatus comprising a television camera having a photosensitive surface, an optical system for focussing a magnified image of the fine object on the photosensitive surface and a scanning means for scanning the photosensitive surface; a scanning signal generator circuit provided to supply a scanning signal to the scanning means of said television camera and including first means for generating horizontal and vertical deflection signals and second means for controlling the amplitude and bias level of each deflection signal, thereby setting the size of a scanning raster formed on the photosensitive surface and the position of the scanning raster scanning a scanning region including at least one of said position marks; a wave shaper for waveshaping the waveform of an image signal generated by said television camera when the photosensitive surface is scanned with said scanning raster; a coordinate detecting means for determining by said scanning means the position of each of said position marks with respect to a fixed point, in response to pulse signals from said wave shaper which correspond to the pattern of the position mark, thereby detecting the coordinate of the position of each said position mark; and an arithmetic operation device for computing the central coordinate and angle of inclination of the fine object based on the data from said coordinate detecting means which represent the coordinates of the two position marks.

2. An apparatus according to claim 1 which includes a coordinate detecting means for counting the number of scanning lines and determining scanning time from start of scanning to the scanning of each of said position marks, in response to pulse signals from said wave shaper which correspond to the pattern of the position mark, thereby detecting the coordinate of each said position mark.

3. An apparatus for detecting the position and inclination of a fine object having at least two position marks on its surface, said apparatus comprising a television camera having a photosensitive surface, an optical system for focussing a magnified image of the fine object on the photosensitive surface and a scanning means for scanning the photosensitive surface; a scanning signal generator circuit provided to supply a scanning signal to said scanning means of said television camera and including first means for generating horizontal and vertical deflection signals, second means for reducing the amplitude of each deflection signal thereby to make a scanning raster formed on said photosensitive surface several times as small as an ordinary scanning raster, third means for controlling the bias level of each deflection signal thereby to shift said scanning raster to a scanning region including at least one of said position marks, and fourth means for supplying the horizontal and vertical deflection signals having their amplitudes reduced by said second means and their bias levels controlled by said third means to said scanning means as scanning signals; a wave shaper for wave-shaping the waveform of an image signal generated by said television camera when the scanning region of said photosensitive surface is scanned by said scanning raster; a coordinate detecting means for determining by said scanning means the position of each of said position marks with respect to a fixed point, in response to pulse signals from said wave shaper which correspond to the pattern of the position mark, thereby detecting the coordinate of each said position mark; and an arithmetic operation device for computing the central coordinate and angle of inclination of the fine object based on the data from said coordinate detecting means which represent the coordinates of the two position marks.

4. An apparatus according to claim 3, wherein a monitor camera is connected to the output of said television camera so as to monitor an image signal of said television camera.

5. An apparatus according to claim 3, wherein said scanning means includes a horizontal deflection coil and a vertical deflection coil.

6. An apparatus according to claim 3, wherein said scanning signal generator circuit is further provided with a memory device which stores data representing the coordinates of position marks provided on the fine object at different positions, and said second and third means control the amplitude and bias level of each deflection signal, respectively, based on the data read out from said memory device.

7. An apparatus according to claim 3, wherein said fine object is an IC pellet having a particular IC pattern and position marks on its surface.

8. An apparatus according to claim 3 which includes a coordinate detecting means for counting the number of scanning lines and determining scanning time from start of scanning to the scanning of each of said position marks, in response to pulse signals from said wave shaper which correspond to the pattern of the position mark, thereby detecting the coordinate of the position of each said position mark.

9. An apparatus according to claim 8, wherein said pulse signals corresponding to the pattern of each position mark are a plurality of pulses which have the same pulse width and have been generated at regular intervals, and said coordinate detecting means is constituted by a mark position detector including a plurality of delay circuits connected to said wave shaper to receive said pulse signals and each providing a delay time longer by the pulse interval of these pulse signals than the immediately preceding delay circuit and an AND circuit connected to said delay circuits to receive the output signals of said delay circuits and said pulse signals and by a coordinate detector including a counter means which starts counting the number of scanning lines and scanning time when said scanning starts from a start point of the scanning raster and which stops counting the number of scanning lines and scanning time when the AND circuit of said mark position detector produces an output signal, and a means for computing the coordinate of each position mark based on the count of said counter means.

* * * * *